(12) United States Patent
Werner, Jr. et al.

(10) Patent No.: US 6,504,375 B1
(45) Date of Patent: Jan. 7, 2003

(54) ELECTROSTATIC VOLTMETER MODULATORS AND METHODS OF MAKING SAME

(75) Inventors: Alan J. Werner, Jr., Rochester, NY (US); Bing R. Hsieh, Webster, NY (US)

(73) Assignee: Xerox Corporation, Stamford, CT (US)

( * ) Notice: Subject to any disclaimer, the term of this patent is extended or adjusted under 35 U.S.C. 154(b) by 79 days.

(21) Appl. No.: 09/722,567

(22) Filed: Nov. 28, 2000

(51) Int. Cl.[7] .............................................. G01R 29/12
(52) U.S. Cl. ................................... 324/458; 324/457
(58) Field of Search ................................ 324/458, 457, 324/72, 72.5, 109

(56) References Cited

U.S. PATENT DOCUMENTS

| | | | |
|---|---|---|---|
| 3,921,087 A | 11/1975 | Vosteen | 324/76.41 X |
| 5,164,776 A * | 11/1992 | Oresick et al. | 355/208 |
| 5,212,451 A | 5/1993 | Werner, Jr. | 324/458 |
| 5,478,616 A * | 12/1995 | Kochem et al. | 428/25.2 |
| 5,489,850 A * | 2/1996 | Werner, Jr. et al. | 324/458 |
| 5,821,344 A * | 10/1998 | Chen et al. | 528/422 |
| 5,853,906 A * | 12/1998 | Hsieh | 428/690 |
| 6,013,404 A * | 1/2000 | Feng et al. | 430/106.6 |
| 6,289,196 B1 * | 9/2001 | Hsieh et al. | 399/266 |

* cited by examiner

Primary Examiner—Christine Oda
Assistant Examiner—T. R. Sundaram
(74) Attorney, Agent, or Firm—Oliff & Berridge, PLC

(57) ABSTRACT

An electrostatic voltmeter modulator for measuring an electrostatic field between the electrostatic voltmeter modulator and a surface includes a shield, a sensing electrode, and a layer disposed between the shield and sensing electrode. The antistatic coating substantially eliminates the accumulation of electrostatic charge on the layer such that the electrostatic field measured by electrostatic voltmeter modulator substantially equals the electrostatic field corresponding to electrostatic charge on the surface. The electrostatic voltmeter modulator can be used in electrostatic imaging apparatus.

39 Claims, 1 Drawing Sheet

FIG. 1
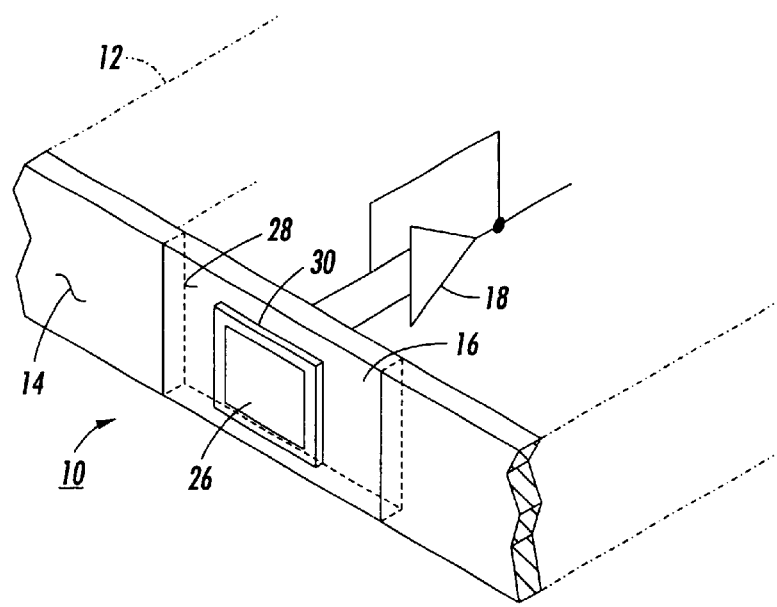
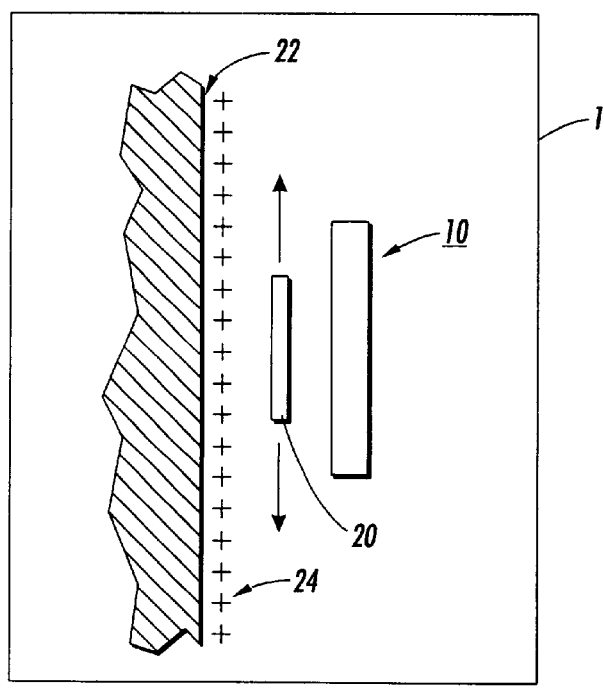
FIG. 2

ELECTROSTATIC VOLTMETER MODULATORS AND METHODS OF MAKING SAME

BACKGROUND OF THE INVENTION

1. Field of Invention

This invention relates to devices for measuring electrostatic fields. This invention also relates to methods of making the devices.

2. Description of Related Art

Electrostatic voltmeter modulators (ESV) are used to measure electrostatic fields associated with electrostatic charges on surfaces. Electrostatic voltmeter modulators provide an output signal that can be used to control an electrostatic process as a function of the measured electrostatic potential. Electrostatic voltmeter modulators enable the adjustment of apparatus characteristics during operation based on the sensed electrostatic field.

In electrostatic voltmeter modulators, the distance or electronic coupling between two surfaces that are capacitively coupled to each other can be mechanically changed relative to time, or modulated. This modulation changes the capacitance of the electrostatic voltmeter modulator with respect to time. In electrostatic voltmeter modulators, a sensing electrode is modulated with respect to the electrostatic field being measured. Different methods of achieving the required modulation of the electrode are known. In some methods, the electrode remains stationary and a vibrating element, or vane, is moved to modulate the field reaching the electrode.

Another method of modulating the sensing electrode involves moving the electrode, which is vibrated relative to the surface being measured. One version of this method moves the electrode in a direction perpendicular to the surface being measured, thereby directly varying the capacitance between the electrode and the surface by changing the distance between the electrode and surface.

Another version utilizes an electromechanical system, such as a "chopper," which mechanically interrupts the coupling between the two surfaces.

SUMMARY OF THE INVENTION

As described above, electrostatic voltmeter modulators are used to measure electrostatic fields. During operation of electrostatic voltmeter modulators to measure electrostatic fields, it is important that electrostatic charge does not accumulate on the electrostatic voltmeters themselves. Such charge build-up affects measurement accuracy because it produces a corresponding electrostatic field that is sensed by the electrostatic voltmeter modulator in addition to the electrostatic field corresponding to electrostatic charge present on the test surface. As a result of charge build-up on electrostatic voltmeter modulators and the added associated electrostatic field produced by the charge build-up, zero shift (which is also known as drift) of the electrostatic voltmeter modulator can occur. Consequently, the electrostatic voltmeter modulator is unable to provide stable and accurate measurements of the actual voltage on the test surface due to the zero shift caused by the charge build-up.

One exemplary use of electrostatic voltmeter modulators is to measure electrostatic charge on photoreceptor surfaces in electrostatic imaging apparatus. Electrostatic reproduction involves charging a photoconductive member, or photoreceptor, and imagewise discharging it, or imagewise exposing it, based on light reflected from an original image being reproduced. The result is an electrostatically-formed latent image on the photoconductive member. The latent image is developed by bringing a charged developer material into contact with the photoconductive member.

To achieve satisfactory imaging in electrostatic imaging apparatus, electrostatic charge on photoconductive members needs to be controlled. This electrostatic charge, and also the electrostatic field associated with the electrostatic charge, changes normally during operation of electrostatic imaging apparatus due to changes in various conditions, including, for example, temperature and pressure. Accordingly, to maintain desired electrostatic charge levels on photoconductive member surfaces, the electrostatic charge level needs to be accurately monitored and adjusted as needed during operation of electrostatic imaging apparatus to compensate for such condition changes. Otherwise, it is at least extremely difficult to accurately control electrostatic charge levels on photoconductive surfaces in response to changing conditions that affect electrostatic charge. Consequently, desired image quality may not be achieved.

U.S. Pat. No. 5,489,850, which is incorporated herein by reference in its entirety, discloses electrostatic voltmeter modulators including antistatic layers and antistatic material coatings. These antistatic layers and material coatings have improved device performance; however, they have not proven to be totally satisfactory to address the problem of charge build-up. Namely, the antistatic layers and material coatings have resistivity properties that are not sufficiently controllable for use in electrostatic voltmeter modulators according to the present invention, to sufficiently reduce charge build-up on electrostatic voltmeter modulators in a consistent manner. Particularly, antistatic materials disclosed in the U.S. Pat. No. 5,489,850 have resistivity values that can vary significantly and do not fall consistently within a desired range for use in the present invention. Namely, the resistivity values of these antistatic materials are not sufficiently consistent and can be either too high or too low. If the resistivity of these antistatic materials is too high, antistatic charge is not dissipated sufficiently quickly from electrostatic voltmeter modulators to substantially prevent charge buildup. The resitivity of these antistatic materials can also be too low and degrade sensitivity of electrostatic voltmeter modulators. In either case, measurement errors can occur in electrostatic voltmeter modulators.

Also, antistatic coating materials disclosed in U.S. Pat. No. 5,489,850 are adhesive materials. Although these adhesive materials can be applied on surfaces by some techniques, they have properties making them unsuitable for applying in a controlled manner by certain other coating processes.

This invention provides electrostatic voltmeter modulators that overcome above-described disadvantages of known devices and enable the measurement of electrostatic fields from charged surfaces with improved accuracy. The electrostatic voltmeter modulators have reduced zero shift, or drift, characteristics, as compared to known devices.

This invention separately provides imaging apparatus that include one or more electrostatic voltmeter modulators that can measure electrostatic fields from charged surfaces with improved accuracy.

Exemplary embodiments of the electrostatic voltmeter modulators for measuring an electrostatic field between the electrostatic voltmeter modulator and a charged surface according to this invention comprise a shield, a sensing electrode and an insulative layer between the shield and the sensing electrode. An antistatic coating is formed on at least the insulative layer.

The antistatic coatings of this invention have advantageous properties. Namely, the antistatic coatings have conductivity properties that provide excellent charge dissipation and substantially eliminate the accumulation of electrostatic charge on the insulative layer. Consequently, the electrical field measured by the electrostatic voltmeter modulator corresponds substantially to an electrical field associated with electrostatic charges on the surface being measured and not to any charge accumulated on the insulative layer.

In addition, the antistatic coatings of this invention can be applied by coating techniques that are not completely suitable for applying antistatic materials that are adhesive materials.

BRIEF DESCRIPTION OF THE DRAWINGS

Preferred embodiments of this invention will be described in detail, with reference to the following figures, in which:

FIG. 1 illustrates an electrostatic voltmeter modulator according to an exemplary embodiment of this invention; and FIG. 2 illustrates an electrostatic voltmeter modulator according to an exemplary embodiment of this invention positioned for measuring an electrostatic charge from a test surface.

DETAILED DESCRIPTION OF PREFERRED EMBODIMENTS

This invention provides electrostatic voltmeter modulators for measuring electrostatic fields from charged surfaces. Embodiments of the electrostatic voltmeter modulators can be used to measure electrostatic fields from various electrostatically charged surfaces.

Electrostatic voltmeter modulators according to this invention have improved measurement stability. Particularly, the electrostatic voltmeter modulators have reduced zero shift, or drift, characteristics. Zero shift, or drift, occurs in known electrostatic voltmeter modulator devices when electrostatic charge accumulates on surfaces of the the devices themselves. This accumulated electrostatic charge produces zero shift. This electrostatic charge has a corresponding electrostatic field that is sensed by the electrostatic voltmeter modulator along with the electrostatic field associated with the electrostatic charge on the test surface. By reducing the accumulation of electrostatic charge on electrostatic voltmeter modulators according to this invention, electrostatic fields associated with such electrostatic charge are also reduced. In addition, zero shift is reduced. Consequently, the electrostatic voltmeter modulators according to this invention can be used to measure electrostatic fields from charged surfaces with improved stability and accuracy because the electrostatic fields that are measured correspond substantially to electrostatic fields associated with the charged surfaces being measured.

The electrostatic voltmeter modulators of this invention can accurately measure electrostatic fields from charged surfaces, thereby enabling the surface charges to be more accurately controlled in response to changing conditions.

Embodiments of the electrostatic voltmeter modulators according to this invention can be used to measure electrostatic fields from charged surfaces of various different devices.

FIG. 1 illustrates an exemplary embodiment of an electrostatic voltmeter modulator 10 according to this invention. The electrostatic voltmeter modulator 10 senses electrostatic fields generated in spaces between the electrostatic voltmeter modulator itself and charged surfaces that are being measured. The electrostatic voltmeter modulator 10 comprises a housing 12 including an outer wall 14. The sensing area includes a sensing electrode 26 surrounded by, and insulated from, a shield 16, which is a larger conducting area that is at the same DC potential as the sensing electrode 26. An amplifier 18 is also at this same DC potential. The amplifier 18 senses differences in voltage between the sensing electrode 26 and the surface being measured that is caused by the mechanical modulation of the modulator and produces a signal that is sufficiently strong to drive signal processing circuits that follow the signal.

The electrostatic voltmeter modulator 10 also comprises a modulating element 20 to modulate the electronic coupling between two surfaces that are capacitively coupled to each other. This modulation changes the capacitance between the two surfaces with respect to time.

FIG. 2, illustrates an imaging apparatus 1, with various components such as photo receptors, drums, belts and the like (not shown), as well as the electrostatic voltmeter modulator 10. During operation of the electrostatic voltmeter modulator 10, the modulating element 20 is disposed between the shielded electrode 26 and a surface 22 within the imaging apparatus 1 that is being measured and on which electrostatic charge 24 is present. An electrostatic field corresponds to the electrostatic charge 24 on the surface 22. The electrostatic field is measured by the electrostatic voltmeter modulator 10 and associated signal processing circuitry.

The surface 22 can be any electrostatically charged surface. For example, the surface 22 can be a surface of a photoreceptor in an electrostatic imaging apparatus. Latent images are formed and developed on photoreceptors. The photoreceptor can have any configuration, such as a photoreceptor drum or a photoreceptor belt. The modulating element 20 is moved to modulate the electrostatic field corresponding to the electrostatic charge 24 on the surface 22.

The shielded electrode 16 comprises the sensing electrode 26, a shield 28, and a layer 30 between the sensing electrode 26 and the shield 28. The sensing electrode 26 and shield 28 are both electrically conductive.

The shielded electrode 16 can have any suitable configuration and size. Typically, the shielded electrode 16 is generally rectangular shaped. However, in embodiments, the shielded electrode 16 can have various other shapes such as, for example, square, circular or oval.

The shield 28 comprises a conductive material. The conductive material forms at least an outer surface of the shield 28. In some embodiments, the shield 28 is formed of a suitable material that itself is conductive.

In preferred embodiments, the shield 28 comprises a base and a coating composed of a conductive material formed on the base to provide the desired electrical conductivity of the shield. For example, the material forming the base of the shield 28 (i.e., the base material) can be any suitable plastic material that can be plated with a conductive material. The plastic material is preferably compatible with desired molding and mechanical characteristics to enable the shield 28 to be molded by preferred molding processes and to provide desired service life. Plastic materials that can provide these desired characteristics are well known to those having ordinary skill in the art. In embodiments in which the base material is coated, the composition of the base material is selected to be compatible with the composition of the conductive material to ensure that the conductive material sufficiently adheres to, and sufficiently covers, the base material.

The conductive material formed on the base material of the shield 28 can be any suitable conductive material. The conductive material is preferably resistant to oxidation. For example, the conductive material can be gold, electroless nickel, or any other suitable metallic material that can be formed on the base material and provide the desired electrical conductivity.

The sensing electrode 26 can be formed of any suitable material that provides sufficient conductivity. In some embodiments of the electrostatic voltmeter modulators according to this invention, the sensing electrode 26 is formed of the same plastic material and has the same conductive coating composition as the shield 28. By forming the shield 28 and sensing electrode 26 of the same plastic materials, the same coating process can coat both the shield 28 and sensing electrode 26. Accordingly, the coating process can be simplified. However, although less desirable, in some embodiments different conductive coating materials can be applied to the shield 28 and the sensing electrode 26.

The layer 30 separating the sensing electrode 26 and shield 28 can be formed of an antistatic material, in order to reduce the build-up of electrostatic charge on the layer 30. Suitable antistatic materials include, for example, polycarbonate, polyurethane, polyester and polyimide. However, although such antistatic materials reduce the build-up of electrostatic charge on the layer, some accumulation of electrostatic charge on the layer 30 can still occur. As stated above, if such electrostatic charge is not effectively dissipated and accumulates on the electrostatic voltmeter modulator, it can produce zero shift and reduce the measurement accuracy of the electrostatic voltmeter modulator 10.

In order to further reduce, and preferably to substantially eliminate, the accumulation of electrostatic charge on the layer 30, in preferred embodiments of the electrostatic voltmeter modulators 10, the layer 30 is coated with an antistatic material. The antistatic material coating allows electrostatic charge to bleed off of the material forming the layer 30. Accordingly, electrostatic charge accumulation on the layer 30 is further reduced, and is preferably substantially eliminated by the antistatic material coating. As a result, electrostatic fields associated with electrostatic charge accumulation on the layer 30 are also substantially reduced. Consequently, any such electrostatic fields resulting from such electrostatic charge is very weak and substantially does not affect accurate measurement of electrostatic fields from charged surfaces by the electrostatic voltmeter modulators 10.

In preferred embodiments of electrostatic voltmeter modulators 10 according to this invention, the antistatic coating material is applied on an insulating material instead of an antistatic material. By forming the antistatic material coating on the insulating material, charge accumulation on the insulating material is substantially reduced.

The material that forms the layer 30 preferably is not coatable with the conductive coating used to coat the shield 28 and sensing electrode 26. That is, the coating material applied on the shield 28 and sensing electrode 26 preferably does not adhere to the layer 30 such that the coating material does not form a coating on the layer 30.

Also, in embodiments, the base material forming the shield 28 and sensing electrode 26 preferably has a different melting temperature than the material forming the layer 30. In these embodiments, the shield 28 and sensing electrode 26 are formed in a first molding process, and the layer 30 is formed in a second molding process. When such two-step molding processes are used, the material that is molded in the first molding process has a higher melting temperature than the material that is molded in the second molding process. The material having the higher melting temperature and that is molded first, can be used to form either the shield 28 and sensing electrode 26, or the layer 30.

In embodiments, the antistatic material coating is applied on only the layer 30. However, because the coating itself has negligible effect on capacitive coupling within the system, in other embodiments, the antistatic material coating can alternatively be applied to portions of the electrostatic voltmeter modulators 10 in addition to the layer 30. For example, the antistatic material coating can be applied over the entire shielded electrode 16. The antistatic material coating can also be applied on surrounding portions of the housing 12. The antistatic material coating can be applied on conductive portions (including the sensing electrode 26, shield 27 and other areas) and non-conductive portions of the electrostatic voltmeter modulators 10 according to this invention. This feature also simplifies exemplary processes of forming the electrostatic voltmeter modulators according to this invention by simplifying coating processes for the antistatic material.

Preferred antistatic materials for forming antistatic material coatings in electrostatic voltmeter modulators according to this invention are described in U.S. Pat. No. 5,853,906 to Hsieh, which is incorporated herein by reference in its entirety. The antistatic materials described by Hsieh are conductive polymer compositions having stable and controlled electrical conductivities (or resistivities). These compositions can alleviate problems of known antistatic coatings that have conductivities that are not controlled and are either too low or too high.

The conductive polymer compositions described by Hsieh and used in this invention comprise an oxidized oligomer salt, a charge transport component and a polymer binder. In embodiments, the polymer binder can comprise a charge transport component.

In exemplary embodiments of this invention, the antistatic materials can comprise an oxidized oligomer salt selected from oxidized oligo-arylamine salts, oxidized oligo-thiophene salts, oxidized oligo-aniline salts, oxidized porphyrin salts, oxidized tetrathiotetracene salts, oxidized tetraselenotetracene salts, oxidized mono and oligo-tetrathiafulvalene salts, oligo-tetraselenafulvalene salts, oxidized oligo-metallocene salts, and mixtures thereof Exemplary charge transport components and polymer binders that are suitable for use in the antistatic materials are described in Hseih.

In exemplary embodiments of the antistatic materials, the weight percent ratio of the oxidized oligomer salt to the charge transport compound is from about 0.01:99.99 to about 99.99:0.01. In exemplary embodiments, the weight percent ratio of oxidized oligomer salts to the combined charge transport compound and polymer binder can be from about 10:90 to about 90:10.

The conductive polymer compositions described by Hsieh and used as antistatic materials in the electrostatic voltmeter modulators 10 of this invention have controlled and stable conductivity. In addition, these compositions have stable conductivity properties extending over a wide range of environmental conditions. These compositions have a conductivity in the range of $10^{-12}$ S/cm to about 1 S/cm. Compositions can be formed that have a selected conductivity that falls within this broad range. For example, in embodiments of this invention, the antistatic materials have a conductivity in the range of $10^{-8}$ to $10^{-10}$ S/cm.

The antistatic material coatings can be formed on the insulating material of the layer 30 by any suitable coating process. For example, the antistatic material coatings can be applied on the insulating material by any suitable painting or dip coating processes. In addition, the antistatic material coatings have viscosity properties that enable them to be applied by any suitable spraying processes.

The antistatic material coatings are applied on the insulating material to a sufficient thickness to cover the insulating material and at least a small portion of conductive surfaces surrounding the insulating material to allow electrostatic charge to effectively bleed off of the insulating material and onto these surrounding conductive surfaces.

As stated above, the antistatic material coatings can be applied on portions of electrostatic voltmeter modulators in addition to the insulating material. The antistatic material coatings can have any suitable thickness in these other areas.

Antistatic material coatings formed in electrostatic voltmeter modulators 10 according to this invention have compositions and properties that enable the coatings to substantially eliminate the accumulation of electrostatic charges on the insulating material (or antistatic layer) on which it is applied. By substantially eliminating the accumulation of such electrostatic charges, electrostatic voltmeter modulators according to this invention have significantly reduced zero shift characteristics and thus improved stability. Consequently, electrostatic voltmeter modulators according to this invention can accurately measure electrostatic fields from charged surfaces.

Various types of modulating elements 20 can be used in embodiments of the electrostatic voltmeter modulators 10 according to this invention. For example, some embodiments of the electrostatic voltmeter modulator 10, such as shown in FIGS. 1 and 2, include a modulating device commonly known as a chopper. The chopper interrupts the coupling between two surfaces. For example, the chopper can comprise a disk defining openings. The disk is rotated relative to the shielded electrode to periodically capacitively couple the electrode and the surface as the electrode is moved parallel to the surface. For example, choppers that are translated or rotated can be used. Choppers are disposed between the shielded electrode and the surface being measured and moved so as to modulate the electrostatic field corresponding to the electrostatic charge on the surface.

In addition, other types of modulating elements can be used in embodiments of the electrostatic voltmeter modulators according to this invention. Other versions of electrostatic voltmeter modulators include a tuning fork system with associated tines or vanes as described, for example, in U.S. Pat. No. 3,921,087, which is incorporated herein by reference in its entirety. The modulator can also comprise vibrating beam systems as described, for example, in U.S. Pat. Nos. 5,212,451 and 5,489,850, which are each incorporated herein by reference in their entirety. The modulator can also comprise a vibrating diaphragm, which changes the spacing between the two surfaces.

In embodiments, modulating elements 20 can be provided separately from the electrostatic voltmeter modulators 10. In other embodiments, modulating elements 20 can be provided with the electrostatic voltmeter modulators 10.

While the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

What is claimed is:

1. An electrostatic voltmeter modulator for measuring an electrostatic field between the electrostatic voltmeter modulator and a charged surface, the electrostatic voltmeter modulator comprising:

a shield;

a sensing electrode;

a layer extending between the sensing electrode and the shield and separating the shield and sensing electrode; and an antistatic coating formed on the layer, the antistatic coating comprising an oxidized oligomer salt, a charge transport component and a polymer binder, wherein:
the sensing electrode, the layer, and the shield extend along and are flush to a surface of the electrostatic voltmeter modulator, and
the antistatic coating substantially eliminates an accumulation of electrostatic charge on the layer such that an electrostatic field measured by the electrostatic voltmeter modulator substantially corresponds to the electrostatic field associated with an electrostatic charge on the charged surface.

2. The electrostatic voltmeter modulator of claim 1, further comprising a modulation element that modulates the electrostatic field between the electrostatic voltmeter modulator and the charged surface.

3. The electrostatic voltmeter modulator of claim 1, wherein the shield and the sensing electrode comprise a conductive material forming at least an outer surface of the shield and the sensing electrode.

4. The electrostatic voltmeter modulator of claim 1, wherein the shield and the sensing electrode each comprise a first material and the layer comprises a second material different from the first material.

5. The electrostatic voltmeter modulator of claim 4, wherein the first material and the second material have different melting temperatures, and the first material and second material are molded in respective first and second molding processes.

6. The electrostatic voltmeter modulator of claim 1, wherein the antistatic material comprises an oxidized oligomer salt selected from the group consisting of oxidized oligo-arylamine salts, oxidized oligo-thiophene salts, oxidized oligo-aniline salts, oxidized porphyrin salts, oxidized tetrathiotetracene salts, oxidized tetraselenotetracene salts, oxidized mono and oligo-tetrathiafulvalene salts, oligo-tetraselenafulvalene salts, oxidized oligo-metallocene salts, and mixtures thereof.

7. The electrostatic voltmeter modulator of claim 1, wherein a weight percent ratio of the oxidized oligomer salt to the charge transport component is from about 0.01:99.99 to about 99.99:0.01, and a weight percent ratio of the oxidized oligomer salt to the combined charge transport component and polymer binder is from about 10:90 to about 90:10.

8. The electrostatic voltmeter modulator of claim 1, wherein the antistatic coating is applied on only the insulating layer.

9. The electrostatic voltmeter modulator of claim 1, wherein the antistatic coating is applied on the layer and on other portions of the electrostatic voltmeter modulator.

10. An electrostatic voltmeter modulator for measuring an electrostatic field between the electrostatic voltmeter modulator and a charged surface, the electrostatic voltmeter modulator comprising:

a sensing electrode;
an insulating layer extending around the sensing electrode;
a shield extending around the insulating layer, the insulating layer separating the shield and sensing electrode;
an antistatic coating formed on the insulating layer, the antistatic coating comprising an oxidized oligomer salt, a charge transport component and a polymer binder; and
a modulation element that modulates an electrostatic field between the electrostatic voltmeter modulator and the surface, wherein:
the sensing electrode, the layer, and the shield extend along and are flush to a surface of the electrostatic voltmeter modulator, and
the shield and sensing electrode each comprise a common base material and a common conductive material coated on the base material.

11. The electrostatic voltmeter modulator of claim 10, wherein the antistatic material comprises an oxidized oligomer salt selected from the group consisting of oxidized oligo-arylamine salts, oxidized oligo-thiophene salts, oxidized oligo-aniline salts, oxidized porphyrin salts, oxidized tetrathiotetracene salts, oxidized tetraselenotetracene salts, oxidized mono and oligo-tetrathiafulvalene salts, oligo-tetraselenafulvalene salts, oxidized oligo-metallocene salts, and mixtures thereof.

12. The electrostatic voltmeter modulator of claim 10, wherein a weight percent ratio of the oxidized oligomer salt to the charge transport component is from about 0.01:99.99 to about 99.99:0.01, and a weight percent ratio of the oxidized oligomer salt to the combined charge transport component and polymer binder is from about 10:90 to about 90:10.

13. The electrostatic voltmeter modulator of claim 10, wherein the base material and an insulating material forming the insulating layer have different melting temperatures, and the base material and insulating material are molded in respective first and second molding processes.

14. An imaging apparatus, comprising:
a photoreceptor having a surface; and
at least one electrostatic voltmeter modulator for measuring an electrostatic field between the electrostatic voltmeter modulator and the surface of the photoreceptor, each electrostatic voltmeter modulator comprising:
a sensing electrode;
an insulating layer extending between the sensing electrode, and a shield, the shield extending around the insulating layer, the insulating layer separating the shield and sensing electrode;
an antistatic coating formed on the insulating material, the antistatic coating comprising an oxidized oligomer salt, a charge transport component and a polymer binder; and
a modulation element that modulates an electrostatic field between the electrostatic voltmeter modulator and the surface wherein:
the sensing electrode, the layer, and the shield extend along and are flush to a surface of the electrostatic voltmeter modulator, and
the antistatic coating substantially eliminates an accumulation of electrostatic charge on the insulating layer such that an electrostatic field measured by the electrostatic voltmeter modulator substantially corresponds to an electrostatic field associated with an electrostatic charge on the surface of the photoreceptor.

15. The imaging apparatus of claim 14, wherein the photoreceptor comprises a photoreceptor belt.

16. The imaging apparatus of claim 14, wherein the photoreceptor comprises a photoreceptor drum.

17. The imaging apparatus of claim 14, comprising a plurality of the electrostatic voltmeter modulators for measuring the electrostatic field between the electrostatic voltmeter modulator and the charged surface.

18. The imaging apparatus of claim 14, wherein the shield comprises a conductive material forming at least an outer surface of the shield, and the sensing electrode comprises a conductive material forming at least an outer surface of the sensing electrode.

19. The imaging apparatus of claim 14, wherein the antistatic material comprises an oxidized oligomer salt selected from the group consisting of oxidized oligo-arylamine salts, oxidized oligo-thiophene salts, oxidized oligo-aniline salts, oxidized porphyrin salts, oxidized tetrathiotetracene salts, oxidized tetraselenotetracene salts, oxidized mono and oligo-tetrathiafulvalene salts, oligo-tetraselenafulvalene salts, oxidized oligo-metallocene salts, and mixtures thereof.

20. The imaging apparatus of claim 14, wherein a weight percent ratio of the oxidized oligomer salt to the charge transport component is from about 0.01:99.99 to about 99.99:0.01, and a weight percent ratio of the oxidized oligomer salt to the combined charge transport component and polymer binder is from about 10:90 to about 90:10.

21. The imaging apparatus of claim 14, wherein the antistatic coating is formed on only the insulating layer of the electrostatic voltmeter modulator.

22. The imaging apparatus of claim 14, wherein the antistatic coating is formed on the insulating layer and on other portions of the electrostatic voltmeter modulator.

23. A method of making an electrostatic voltmeter modulator, comprising:
forming a sensing electrode on a surface of the electrostatic voltmeter modulator;
forming an insulating layer on the surface of the electrostatic voltmeter modulator, the insulating layer flush with and extending around the sensing electrode;
forming a shield on the surface of the electrostatic voltmeter modulator, the shield flush with and extending around the insulating layer; and
forming an antistatic coating on the insulating layer, the antistatic coating comprising an oxidized oligomer salt, a charge transport component and a polymer binder, wherein:
the sensing electrode, the layer, and the shield extend along a surface of the electrostatic voltmeter modulator, and
the antistatic coating is usable to substantially eliminate an accumulation of electrostatic charge on the insulating layer such that should the electrostatic voltmeter modulator be placed relative to charged surface, an electrostatic field measured by electrostatic voltmeter modulator substantially corresponds to an electrostatic field associated with an electrostatic charge on the charged surface.

24. The method of claim 23, wherein the shield and sensing electrode comprise a conductive material forming at least an outer surface of the shield and sensing electrode.

25. The method of claim 23, wherein the shield and sensing electrode each comprise a first material and the insulating layer comprises a second material different from the first material.

26. The method of claim 25, wherein the first material and the second material have different melting temperatures.

27. The method of claim 25, wherein the first material and second material are molded in first and second molding processes, respectively.

28. The method of claim 23, wherein the antistatic material comprises an oxidized oligomer salt selected from the group consisting of oxidized oligo-arylamine salts, oxidized oligo-thiophene salts, oxidized oligo-aniline salts, oxidized porphyrin salts, oxidized tetrathiotetracene salts, oxidized tetraselenotetracene salts, oxidized mono and oligo-tetrathiafulvalene salts, oligo-tetraselenafulvalene salts, oxidized oligo-metallocene salts, and mixtures thereof.

29. The method of claim 23, wherein forming the antistatic coating comprises selecting an amount of the oxidized oligimer salt such that a weight percent ratio of the oxidized oligomer salt to that of the charge transport component from about 0.01:99.99 to about 99.99:0.01, and a weight percent ratio of the oxidized oligomer salt to that of the combined charge transport component and polymer binder from about 10:90 to about 90:10.

30. The method of claim 23, wherein the antistatic coating is formed on only the layer.

31. The method of claim 23, wherein the antistatic coating is formed on the insulating layer and on other portions of the electrostatic voltmeter modulator.

32. The method of claim 23, wherein the antistatic coating is applied by a spraying process.

33. An imaging apparatus, comprising:
a photoreceptor having a surface; and
at least one electrostatic voltmeter modulator for measuring an electrostatic field between the electrostatic voltmeter modulator and the surface of the photoreceptor, each electrostatic voltmeter modulator comprising:
a sensing electrode;
an insulating layer extending between the sensing electrode, and a shield, the shield extending around the insulating layer, the insulating layer separating the shield and sensing electrode;
an antistatic coating formed on the insulating material, the antistatic coating comprising an oxidized oligomer salt, a charge transport component and a polymer binder; and
a modulation element that modulates an electrostatic field between the electrostatic voltmeter modulator and the surface, wherein:
the sensing electrode, the layer, and the shield are coplanar along a surface of the electrostatic voltmeter, and
the antistatic coating substantially eliminates an accumulation of electrostatic charge on the insulating layer such that an electrostatic field measured by the electrostatic voltmeter modulator substantially corresponds to an electrostatic field associated with an electrostatic charge on the surface of the photoreceptor.

34. The imaging apparatus of claim 33, wherein the photoreceptor comprises a photoreceptor belt.

35. The imaging apparatus of claim 33, wherein the photoreceptor comprises a photoreceptor belt.

36. The imaging apparatus of claim 33, comprising a plurality of the electrostatic voltmeter modulators for measuring the electrostatic field between the electrostatic voltmeter modulator and the charged surface.

37. The imaging apparatus of claim 33, wherein a weight percent ratio of the oxidized oligomer salt to the charge transport component is from about 0.01:99.99 to about 99.99:0.01, and a weight percent ratio of the oxidized oligomer salt to the combined charge transport component and polymer binder is from about 10:90 to about 90:10.

38. The imaging apparatus of claim 33, wherein the antistatic coating is formed on only the insulating layer of the electrostatic voltmeter modulator.

39. The imaging apparatus of claim 33, wherein the antistatic coating is formed on the insulating layer and on other portions of the electrostatic voltmeter modulator.

* * * * *